US008852985B2

(12) United States Patent
Cai et al.

(10) Patent No.: US 8,852,985 B2
(45) Date of Patent: Oct. 7, 2014

(54) GRAPHENE PRESSURE SENSORS

(75) Inventors: Jin Cai, Cortlandt Manor, NY (US); Yanqing Wu, Ossining, NY (US); Wenjuan Zhu, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/600,469

(22) Filed: Aug. 31, 2012

(65) Prior Publication Data

US 2013/0273682 A1    Oct. 17, 2013

Related U.S. Application Data

(63) Continuation of application No. 13/445,029, filed on Apr. 12, 2012.

(51) Int. Cl.
*H01L 21/00* (2006.01)
*H01L 29/02* (2006.01)

(52) U.S. Cl.
USPC ............. 438/53; 257/415; 257/416; 257/417; 438/50

(58) Field of Classification Search
CPC . H01L 29/0649; H01L 29/1606; H01L 29/00; G01L 7/08
USPC .................... 438/50; 257/E29, 2, 9, 415–419
See application file for complete search history.

(56) References Cited

U.S. PATENT DOCUMENTS

| | | | |
|---|---|---|---|
| 7,409,864 B2 | 8/2008 | Yane et al. | |
| 2005/0053525 A1* | 3/2005 | Segal et al. | 422/88 |
| 2005/0212014 A1* | 9/2005 | Horibe et al. | 257/213 |
| 2006/0063354 A1* | 3/2006 | Fortin et al. | 438/459 |
| 2010/0140723 A1 | 6/2010 | Kurtz et al. | |
| 2012/0056161 A1* | 3/2012 | Avouris et al. | 257/24 |

OTHER PUBLICATIONS

Smith ("Strain Effects on Electrical Properties of Suspended Graphene" Master Thesis in Integrated Devices and Circuits Royal Institute of Technology (KTH), Available from: Dec. 20, 2011.*
Koenig et al. ("Ultrastrong adhesion of graphene membrane" Nature Nanotechnology 6, pp. 543-546, (2001) Published online Aug. 14, 2011.*
C. Lee et al, "Measurement of the Elastic Properties and Intrinsic Strength of Monolayer Graphene," Science, Jul. 2008, pp. 385-388, vol. 321, No. 5887.
A. Turchanin, "One Nanometer Thin Carbon Nanosheets with Tunable Conductivity and Stiffness," Advanced Materials, Mar. 2009, pp. 1233-1237, vol. 21, No. 12.
Y. Lee et al., "Wafer-Scale Synthesis and Transfer of Graphene Films," Nano Letters, Feb. 2010, pp. 490-493, vol. 10, No. 2.
O. Kanoun et al., "Potential of Carbon Nanotubes for Sensor Applications," IEEE 5th International Multi-Conference on Systems, Signals and Devices (SSD), Jul. 2008, pp. 1-6.

(Continued)

*Primary Examiner* — Asok K Sarkar
*Assistant Examiner* — Dmitriy Yemelyanov
(74) *Attorney, Agent, or Firm* — Vazken Alexanian; Ryan, Mason & Lewis, LLP

(57) ABSTRACT

Semiconductor nano pressure sensor devices having graphene membrane suspended over open cavities formed in a semiconductor substrate. A suspended graphene membrane serves as an active electro-mechanical membrane for sensing pressure, which can be made very thin, from about one atomic layer to about 10 atomic layers in thickness, to improve the sensitivity and reliability of a semiconductor pressure sensor device.

8 Claims, 7 Drawing Sheets

(56) References Cited

OTHER PUBLICATIONS

D. Pandey et al., "Graphene Based Sensor Development," http://phys570x.wikispaces.com/file/view/proposal-report_graphene_sensor.pdf, Apr. 2009, 10 pages.

I.W. Frank et al., "Mechanical Properties of Suspended Graphene Sheets," Journal of Vacuum Science & Technology B, Microelectronics and Nanometer Structures, Nov./Dec. 2007, pp. 2558-2561, vol. 25, No. 6.

* cited by examiner

GRAPHENE PRESSURE SENSORS

CROSS-REFERENCE TO RELATED APPLICATION

This application is a Continuation of U.S. patent application Ser. No. 13/445,029, filed on Apr. 12, 2012, the disclosure of which is incorporated herein by reference.

TECHNICAL FIELD

The field relates generally to semiconductor nano-devices for sensing pressure and, in particular, semiconductor nano-pressure sensor devices that are constructed using thin graphene membranes.

BACKGROUND

In general, semiconductor nano pressure sensor devices are used to measure the pressure of gases or liquids, for example, and are utilized in various control and real-time monitoring applications. Semiconductor nano pressure sensor devices can also be utilized to indirectly measure other variables such as fluid flow, gas flow, speed, water level, and altitude, for example. Commonly used pressure sensors implement a strain gauge device with an active membrane that is made of silicon (monocrystalline), a polysilicon thin film, a bonded metal foil, a thick film, or a sputtered thin film, for example. Typically, the thinner the active membrane, the more deformation there will be of the membrane material in response to external pressure, thereby providing higher sensitivity and precision. It is very challenging, however, to produce ultra-thin silicon membrane for use with a pressure sensor device due to the brittle nature of the material.

SUMMARY

Aspects of the invention include semiconductor nano-devices for sensing pressure and, in particular, semiconductor nano pressure sensor devices that are constructed using thin graphene membranes. A suspended graphene film serves as an active electro-mechanical membrane for sensing pressure, which can be made very thin, from about one atomic layer to about 10 atomic layers in thickness, to greatly improve the sensitivity and reliability of a semiconductor pressure sensor device.

For example, in one aspect of the invention, a semiconductor pressure sensor device includes an insulating layer disposed on a semiconductor substrate, wherein a recessed cavity is formed in the insulating layer. A first graphene membrane is disposed on a surface of the insulating layer completely covering the recessed cavity. A first sense electrode and a second sense electrode are disposed on the insulating layer on opposing sides of, and in contact with, the first graphene membrane. A sealing ring forms a seal around outer sidewalls of the first and second sense electrodes and the first graphene membrane.

In another aspect of the invention, the semiconductor pressure sensor device further includes a second graphene membrane disposed on a surface of the insulating layer in a region adjacent to the first graphene membrane. A third sense electrode and a fourth sense electrode are disposed on the insulating layer on opposing sides of, and in contact with, the second graphene membrane. A second sealing ring forms a seal around outer sidewalls of the third and fourth sense electrodes and the second graphene membrane.

In yet another aspect of the invention, a method of forming a semiconductor pressure sensor device includes forming an insulating layer on a semiconductor substrate, forming a recessed cavity in the insulating layer, forming a first graphene membrane on a surface of the insulating layer completely covering the recessed cavity, forming a first sense electrode and a second sense electrode on the insulating layer on opposing sides of, and in contact with, the first graphene membrane, and forming a sealing ring around outer sidewalls of the first and second sense electrodes and the first graphene membrane.

In another aspect of the invention, the method further includes forming a second graphene membrane on a surface of the insulating layer in a region adjacent to the first graphene membrane, forming a third sense electrode and a fourth sense electrode on the insulating layer on opposing sides of, and in contact with, the second graphene membrane; and forming a second sealing ring around outer sidewalls of the third and fourth sense electrodes and the second graphene membrane.

These and other aspects, features and embodiments of the present invention will become apparent from the following detailed description of preferred embodiments, which is to be read in conjunction with the accompanying figures.

BRIEF DESCRIPTION OF THE DRAWINGS

FIGS. 3A, 3B, 3C, 3D, 3E, and 3F schematically illustrate a method for constructing a graphene pressure sensor device at various stages of fabrication, according to an aspect of the invention, wherein:

FIG. 3A, a cross-sectional view is shown of the semiconductor nano device at an initial stage of fabrication after forming an insulating layer on a semiconductor substrate, FIG. 3B is a cross-sectional view of the structure of FIG. 3A after etching a cavity in the insulating layer, FIG. 3C is a cross-sectional view of the structure of FIG. 3B after forming a graphene layer over the insulating layer and forming a second etch mask over the graphene layer, FIG. 3D is a cross-sectional view of the structure of FIG. 3C after etching the graphene layer to form the supported graphene membrane and the suspended graphene membrane, FIG. 3E is a cross-sectional view of the structure of FIG. 3D after forming a layer of conductive material over the graphene membranes and insulating layer, and forming an etch mask to define sense electrodes, FIG. 3F is a cross-sectional view of the structure of FIG. 3E after etching the exposed portions of the layer of conductive material to form the sense electrodes.

DETAILED DESCRIPTION OF THE PREFERRED EMBODIMENTS

Figure 1A:
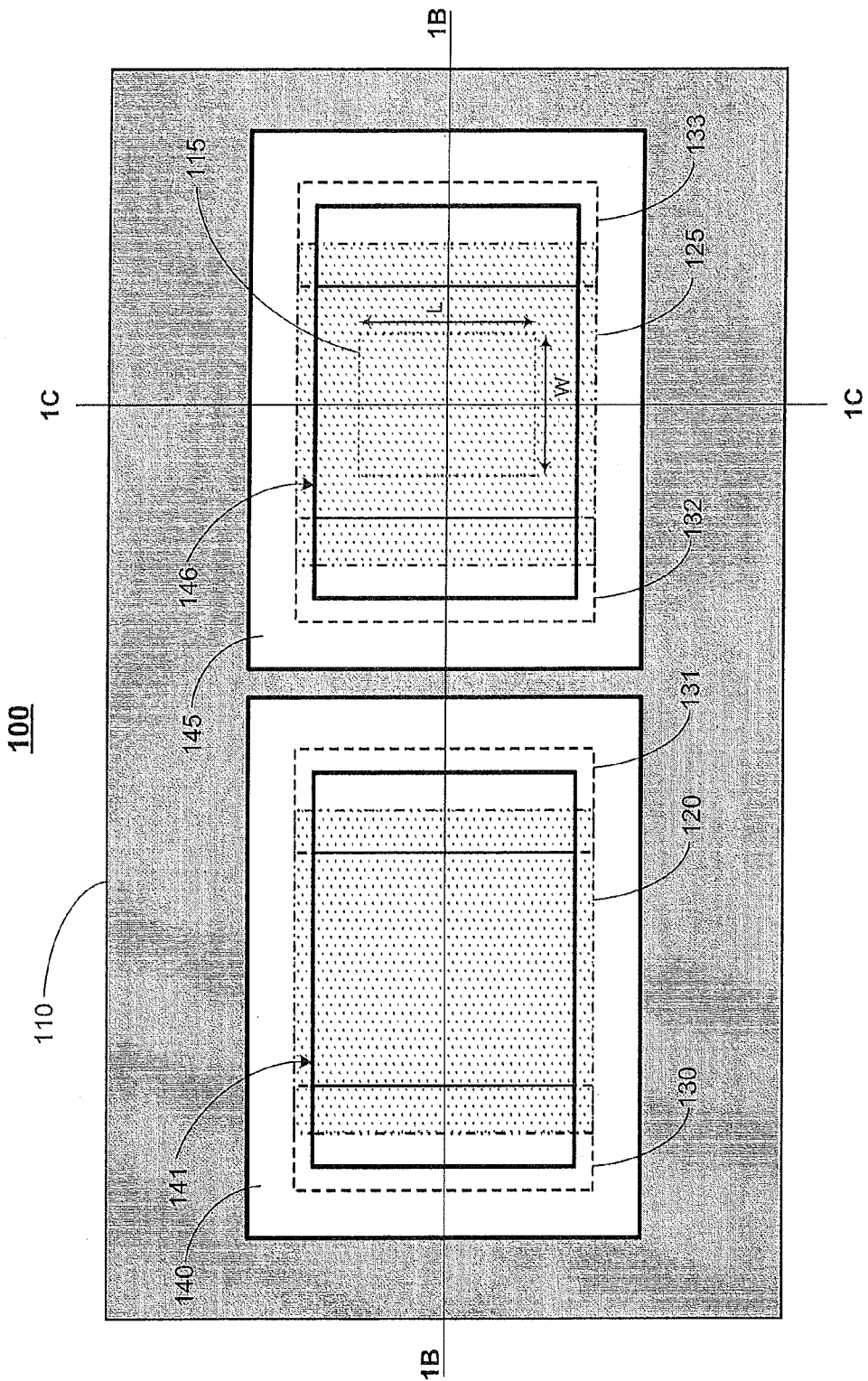
FIG. 1A is a top schematic plan view of a semiconductor nano pressure sensor device according to an aspect of the invention.
Figure 1B:
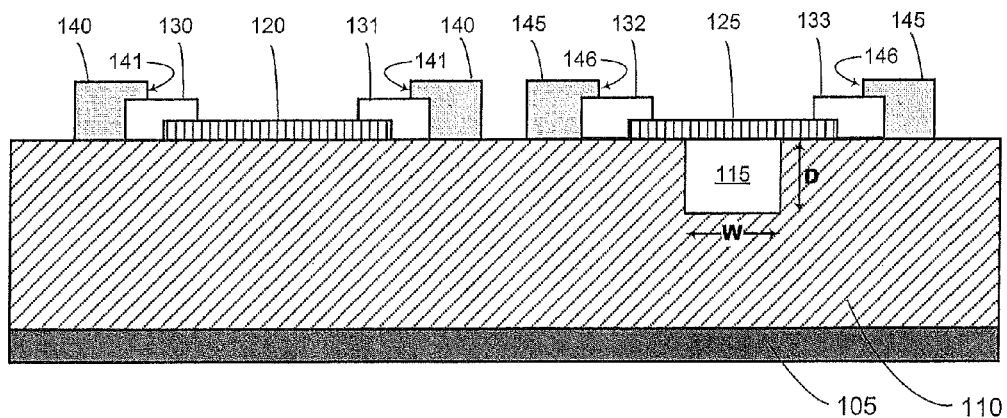
FIG. 1B is a side schematic view of the semiconductor nano pressure sensor device taken along line 1B-1B in FIG. 1A.
Figure 1C:
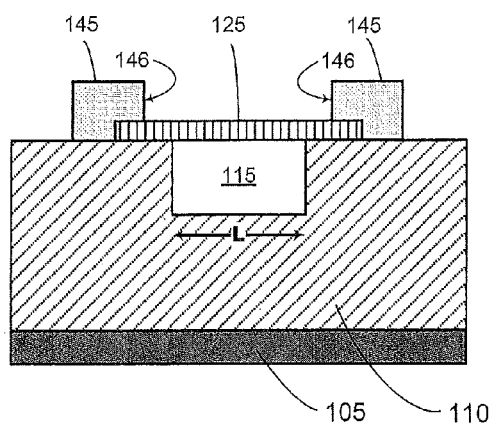
FIG. 1C is a side schematic view of the semiconductor nano pressure sensor device taken along line 1C-1C in FIG. 1A.

Preferred embodiments of the invention will now be described in further detail with regard to semiconductor nano pressure sensor devices that are constructed using thin graphene membranes. For example, FIGS. 1A, 1B, and 1C collectively illustrate a semiconductor nano pressure sensor device 100 according to an aspect of the invention. In particular, FIG. 1A is a top schematic plan view of the semiconductor nano pressure sensor device 100, FIG. 1B is a side schematic view of the semiconductor nano pressure sensor device 100 taken along line 1B-1B in FIG. 1A, and FIG. 1C is a side schematic view of the semiconductor nano pressure sensor device 100 taken along line 1C-1C in FIG. 1A. Referring collectively to FIGS. 1A, 1B and 1C, the nano pressure sensor device 100 generally comprises a bulk semiconductor substrate 105, an insulating layer 110, a recessed cavity 115 formed in the insulating layer 110, a first graphene membrane 120 (supported membrane), a second graphene membrane 125 (suspended membrane) that is formed over the recessed cavity 115, sense electrodes 130, 131, 132 and 133, and sealing rings 140 and 145.

In general, the graphene membranes 120 and 125 are used to detect pressure of an applied test gas based on changes in resistance of the graphene membranes 120, 125, as will be discussed in further detail below with reference to FIGS. 2A and 2B. As specifically shown in FIG. 1A, for example, the graphene membranes 120 and 125 are rectangular-shaped membranes, wherein the sense electrodes 130 and 131 are formed in contact with opposing sides of the supported graphene membrane 120, and the sense electrodes 132 and 133 are formed in contact with opposing sides of the suspended graphene membrane 125. The sense electrodes 130 and 131 partially overlap the top surface of the supported graphene membrane 120 along the edges thereof. Similarly, the sense electrodes 132 and 133 partially overlap the top surface of the suspended graphene membrane 125 along the edges thereof.

The sense electrodes 130 and 131 are used to apply a control voltage across the supported graphene membrane 120 and measure its resistance based on current flowing through the supported graphene membrane 120 between the sense electrodes 130 and 131. Similarly, the sense electrodes 132 and 133 are used to apply a control voltage across the suspended graphene membrane 125 and measure its resistance based on current flowing through the suspended graphene membrane 125 between the sense electrodes 132 and 133.

As further depicted in FIG. 1A, the sealing ring 140 (which has an inner edge 141) forms a seal around outer sidewalls of the sense electrodes 130 and 131 and the supported graphene membrane 120. In addition, the sealing ring 140 partially overlaps the top surface of the supported graphene membrane 120 and sense electrodes 130 and 131 along the outer sidewalls thereof. In particular, the inner edge 141 of the sealing ring 140 is disposed on top of the sense electrodes 130 and 131 and supported graphene membrane 120, and extends past three sides of the sense electrodes 130 and 131, and two opposing sides of the supported graphene membrane 120. The sealing ring 140 serves to prevent external gases from leaking underneath the supported graphene membrane 120 from under the side edges of the supported graphene membrane 120 and from under the side edges of the sense electrodes 130 and 131.

Similarly, the sealing ring 145 (which has an inner edge 146) forms a seal around outer sidewalls of the sense electrodes 132 and 133 and the suspended graphene membrane 125. In addition, the sealing ring 145 partially overlaps the top surface of the suspended graphene membrane 125 and sense electrodes 132 and 133 along the outer sidewalls thereof. In particular, the inner edge 146 of the sealing ring 145 is disposed on top of the sense electrodes 132 and 133 and suspended graphene membrane 125, and extends past three sides of the sense electrodes 132 and 133, and two opposing sides of the suspended graphene membrane 125. The sealing layer 145 serves to prevent external gases from leaking into or out of the cavity 115 from under the side edges of the suspended graphene membrane 125 and from under the side edges of the sense electrodes 132 and 133.

Moreover, as shown in FIGS. 1A, 1B and 1C, the suspended graphene membrane 125 is formed to extend past each of the peripheral surface edges of the recessed cavity 115 to completely cover the recessed cavity 115. The recessed cavity 115 can be filled with air, or it may be formed to contain a vacuum. The combination of the suspended graphene membrane 125, sense electrodes 132, 132 and the sealing ring 145 serve to seal the air or vacuum within the recessed cavity 115 and prevent any test gases from infiltrating the recessed cavity 115 during use. As shown in FIGS. 1B and 1C, the recessed cavity is formed to a depth D, a width W and a length L. As specifically shown in FIG. 1B, the depth D of the recessed cavity 115 is preferably in range of about 20 nm to about 300 nm. Moreover, as shown in FIGS. 1A and 1B, the width W of the cavity 115 (in the direction extending between the sense electrodes 132 and 133) is in a range of about 0.2 um to about 5.0 um, or more preferably from about 0.5 um to about 2.0 um. Furthermore, as specifically shown in FIGS. 1A and 1C, the length L of the cavity 115 (in the direction extending along the sense electrodes 132 and 133 is in a range of about 0.2 um to about 5.0 um. An exemplary method and materials used for fabricating a semiconductor nano-device 100 as depicted in FIGS. 1A, 1B and 1C, will be discussed in further detail below with reference to FIGS. 3A~3G.

Figure 2A:
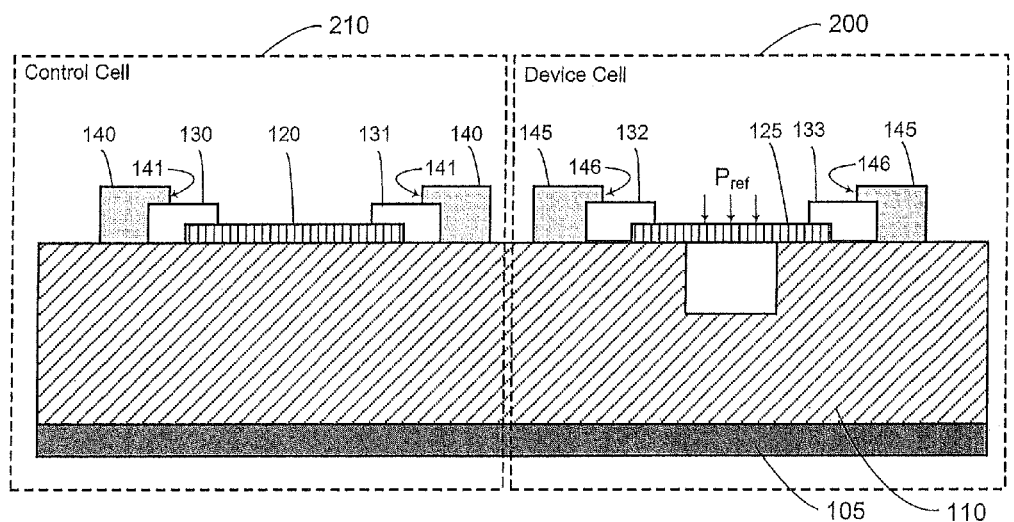
FIGS. 2A and 2B schematically illustrate methods for operating semiconductor nano pressure sensor device according various aspects of the invention.
Figure 2B:
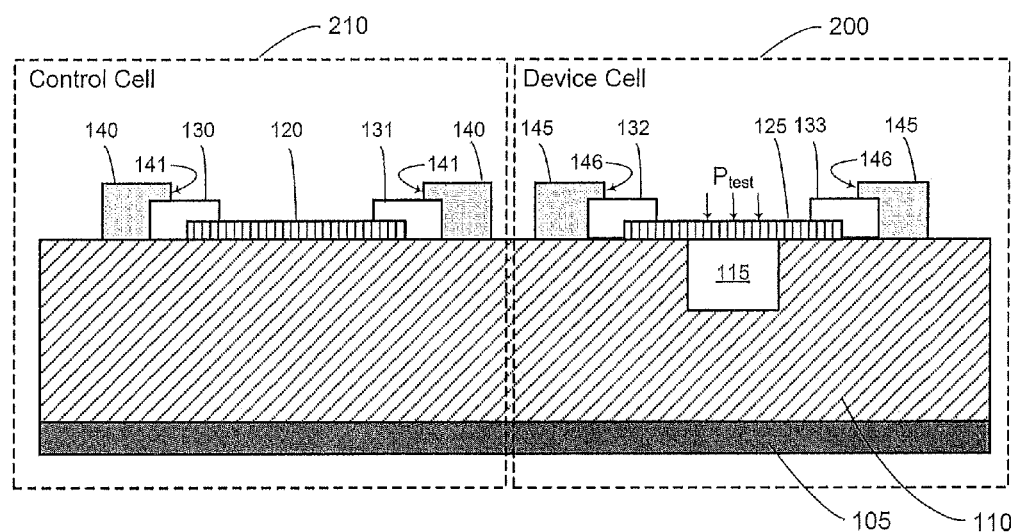

FIGS. 2A and 2B schematically illustrate methods for operating a semiconductor nano pressure sensor device according various aspects of the invention to determine pressure of a test gas. In general, FIGS. 2A and 2B illustrate the structure shown in FIG. 1B, wherein the portion of the device 100 that comprises the suspended graphene membrane 125 is utilized as a device cell 200 and the portion of the device 100 that comprises the supported graphene membrane 120 is optionally utilized as a control cell 210. In one exemplary embodiment of the invention, in a first mode of operation, a method for sensing the pressure of a test ambient is performed using only the device cell 200 portion of the pressure sensor device 100 (i.e., the control cell 210 is an optional structure). In another exemplary embodiment of the invention, a method for sensing the pressure of a test ambient is performed using both the device cell 200 and control cell 210 portions of the pressure sensor device 100.

More specifically, in the first mode of operation, as shown in FIG. 2A, a first step comprises placing the pressure sensor device 100 in a reference ambient having a known pressure $P_{ref}$, and then measuring the channel resistance of suspended graphene membrane 125, which is used as a reference resistance $R_{ref}$. This reference resistance $R_{ref}$ is determined by placing a control voltage across the sense electrodes 132 and 133 and measuring the resistance between the sense electrodes 132 and 133. Referring to FIG. 2B, a next step comprises placing the pressure sensor device 100 in a test ambient having an unknown pressure $P_{test}$, and then measuring the channel resistance of suspended graphene membrane 125, which is used as a test resistance $R_{test}$. This test resistance $R_{test}$ is determined by placing the same control voltage across the sense electrodes 132 and 133 and measuring the resistance between the sense electrodes 132 and 133.

Once the reference $R_{ref}$ and test $R_{test}$ resistances are determined, the pressure of the test ambient $P_{test}$ can be determined by the following equation:

$$|R_{test}-R_{ref}|=\alpha|P_{test}-P_{ref}| \qquad \text{Equ. (1)}$$

wherein the value α represents the piezo-resistivity factor. In this mode of operation, the different forces of the applied pressure causes the suspended graphene membrane to deflect and stretch to different degrees, which cause changes in resistance of the thin suspended graphene membrane 125.

The use of graphene as an active electro-mechanical membrane of the pressure sensor device 100 discussed herein is advantageous for various reasons. For example, graphene is known to have a breaking strength 200 times greater than steel. In this regard, an active graphene membrane (e.g., the suspended graphene membrane 125) can be made very thin, down to one atomic layer. Moreover, with an extremely thin and strong active graphene membrane, the pressure sensor can operate with higher sensitivity as compared to an active Si membrane.

In another mode of operation, the optional control cell 210 can be used as a control measure to eliminate any measured change of resistance of the suspended graphene membrane 125 that is caused by chemical doping of a test gas. In particular, in the exemplary method discussed above, when the ambient changes from the reference ambient to the test ambient (test gas), the test gas can chemic ally dope the suspended graphene membrane 125, which adds to the change in resistance in addition to the change in resistance caused by the stretching/deflection of the suspended graphene membrane 125 due to the test ambient pressure. In this regard, the control cell 210 can be used to determine the change in resistance of the graphene membrane due to chemical doping and eliminate this factor.

More specifically, referring to FIGS. 2A and 2B, when the reference ambient and test ambient is applied to the pressure sensor device 100, in addition to measuring the channel resistance of the suspended graphene membrane 125, the channel resistance of the supported graphene membrane 120 in the control cell 210 is also measured. The change in resistance $\Delta R_{ctr}$ of the supported graphene membrane 120 in the control cell 210 represents the change in resistance due to chemical doping of the supported graphene membrane 120 (which is the same or similar to the change in resistance due to chemical doping of the suspended graphene membrane 125). On the other hand, the change in resistance $\Delta R_{Dev}$ of the suspended graphene membrane 125 in the device cell 200 is due to both the chemical doping and the pressure change. In this regard, the resistance caused by the change in pressure in the device cell 200 can be determined by $\Delta R_{pressure} = \Delta R_{Dev} - \Delta R_{ctr}$. After each test, the chemical doping of the graphene membranes 120 and 125 can be removed using known techniques.

Figure 3A:
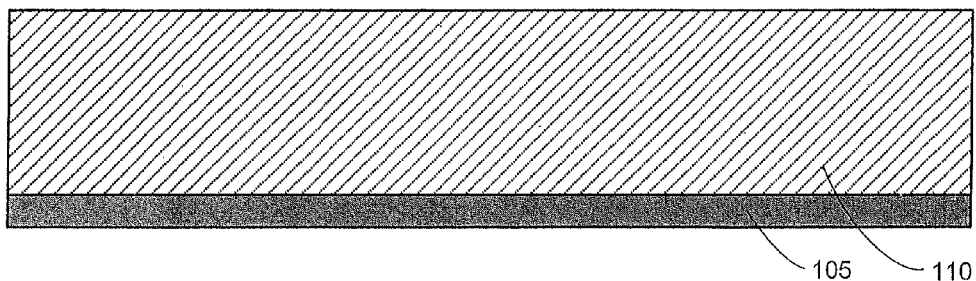

FIGS. 3A, 3B, 3C, 3D, 3E, 3F, and 3G schematically illustrate a method for constructing a semiconductor nano pressure sensor device according to an exemplary embodiment of the invention. In particular, FIGS. 3A, 3B, 3C, 3D, 3E, 3F, and 3G are cross-sectional views of the semiconductor pressure sensor device 100 of FIGS. 1A, 1B, and 1C at various stages of fabrication. Referring initially to FIG. 3A, a cross-sectional view is shown of the semiconductor nano device 100 at an initial stage of fabrication after forming an insulating layer 110 on a semiconductor substrate 105. In particular, FIG. 3A illustrates an initial stage of fabrication wherein the device 100 comprises a semiconductor substrate 105 and an insulating layer 100 formed on top of the substrate 105. In one exemplary embodiment of the invention, the substrate 105 can be a silicon substrate, or a substrate formed with any other type of substrate material, or multiple layers of substrate materials, commonly used in VLSI fabrication methods.

The insulating layer 110 may be formed using various types of dielectric or insulating materials such as oxides and nitrides, which are commonly used in VLSI fabrication including, but not limited to silicon nitride, silicon oxide, hafnium oxide, zirconium oxide, aluminum oxide, aluminum nitride, boron nitride or a combination of such materials. The insulating layer 110 may be formed using known deposition techniques. The insulating layer 110 may be a nitride layer or an oxide layer that is formed by growing oxide on silicon using well-known semiconductor fabrication techniques. For example, the insulating layer 110 may be formed of silicon nitride, silicon oxide, hafnium oxide, zirconium oxide, aluminum oxide, aluminum nitride, or boron nitride or a combination thereof. In a preferred embodiment, the insulating layer 110 has a thickness of about 90 nm or about 280 nm (or any suitable thickness to provide sufficient contrast for photolithographic etching of features on top of the insulating layer 110, as is understood by those of ordinary skill in the art).

Figure 3B:
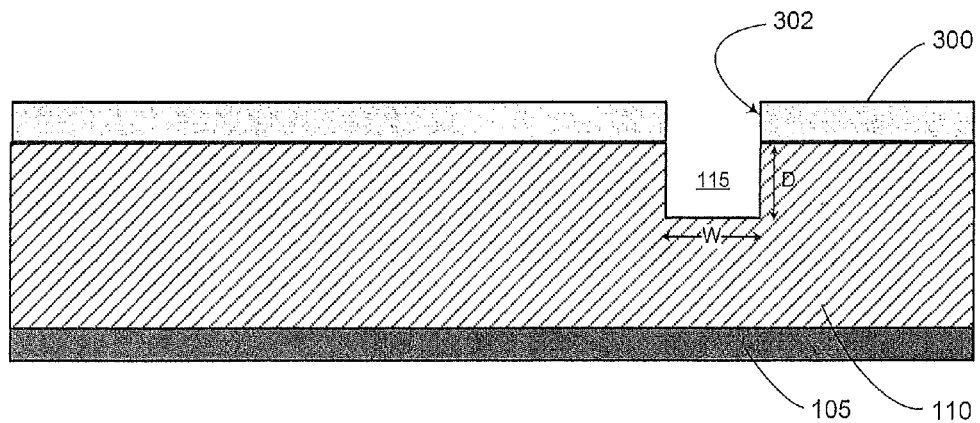

FIG. 3B is a cross-sectional view of the structure of FIG. 3A after etching a cavity 115 in the insulating layer 110. With this process, an etch mask material is deposited over the insulating layer 110 and then patterned to form an etch mask 300 having an opening 302, which serves to define a recessed cavity to be subsequently etched in the insulating layer 110. The etch mask 300 may be photoresist mask that is formed using known photolithographic methods. After forming the etch mask 300, an etching process is performed to etch the portions of the insulating layer 110 exposed through the opening 302 in the etch mask 300 to form the recessed cavity 115 in the insulating layer 110. In one exemplary embodiment, an anisotropic dry etch process, such as RIE (reactive ion etching) may be used to etch the exposed portion of the insulating layer 110 that is exposed through the opening 302 of the etch mask 300 to form the cavity 115. The etching techniques and environments used to etch the insulating layer 110 will vary depending on what materials are used to form the insulating layer 110. As noted above, in one preferred embodiment, the cavity 125 may be formed having a width "W" in a range of about 0.2 um to about 5.0 um, or more preferably, a range of about 0.5 um to about 2.0 um, and etched to a depth "D" in a range of about 20 nm to about 300 nm.

Figure 3C:
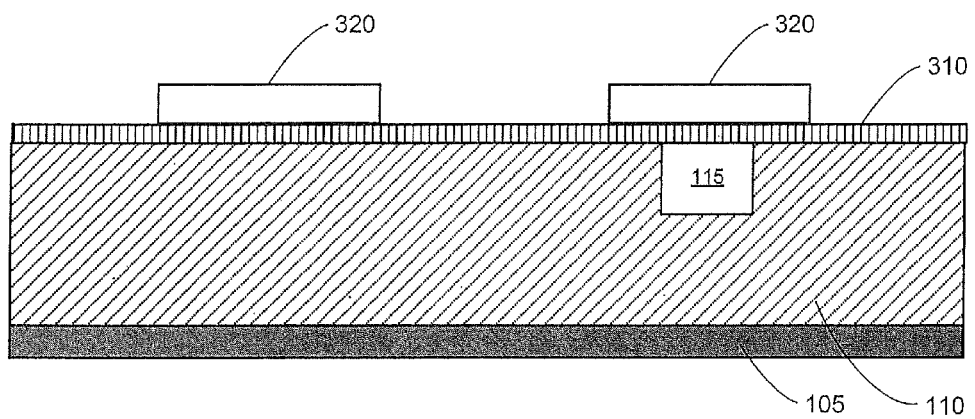

FIG. 3C is a cross-sectional view of the structure of FIG. 3B after forming a graphene layer 310 over the insulating layer 110 and forming a second etch mask 320 over the graphene layer 310. In one preferred embodiment, the graphene layer 310 is formed on a separate substrate and transferred onto the surface of the insulating layer 110 using any known technique that is suitable for the given application. For instance, in one standard method, a thin graphene film can be grown by chemical vapor deposition on copper foil. Then a thin film of poly(methyl methacrylate) (PMMA) is spun onto the graphene surface. Then the PMMA/graphene/copper stack is soaked in a copper etchant to remove copper. The PMMA/graphene film can then be transferred to the target substrate. The PMMA can then be removed by using acetone. The result of this process is the formation of the graphene layer 310 on the surface of the insulating layer 110, whereby the graphene layer 310 will sufficiently adhere to the planarized surface via Van der Waals interaction forces. In a preferred embodiment of the invention, the graphene layer 310 has a thickness in a range of about one atomic layer to about ten atomic layers.

After forming the graphene layer 310, the etch mask 320 is formed by depositing an etch mask material over the graphene layer 310 and patterning the etch mask material to form the etch mask 320 pattern. The etch mask 320 may be a photoresist mask that is formed using known photolithographic methods. The etch mask 220 is patterned to expose regions of the graphene layer 310 to be etched away, while covering regions of the graphene layer 310 that define the supported and suspended graphene membranes.

Figure 3D:
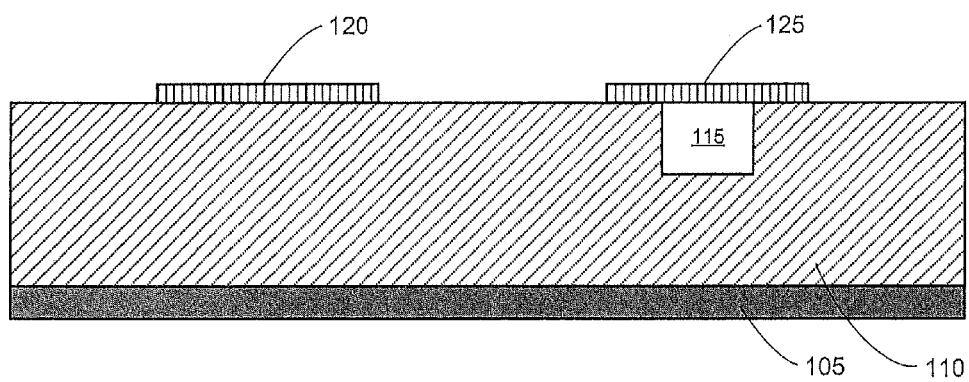

FIG. 3D is a cross-sectional view of the structure of FIG. 3C after etching the graphene layer 310 using the etching mask 320 to form the supported graphene membrane 120 and the suspended graphene membrane 125. The supported graphene membrane 120 is disposed entirely on the surface of the insulating layer 110, whereas the suspended graphene membrane 125 is disposed over the recessed cavity 115 region such that a portion of the suspend graphene membrane 125 is suspended over the cavity 115 and the peripheral regions of the suspended graphene membrane contact a portion of the insulating layer 110 surface surrounding around the periphery of the recessed cavity 115. The graphene layer 310 may be etched using any suitable known method, such as using an oxygen plasma. After etching the graphene layer 310, the etch mask 320 is removed, resulting in the structure depicted in FIG. 3D.

Figure 3E:
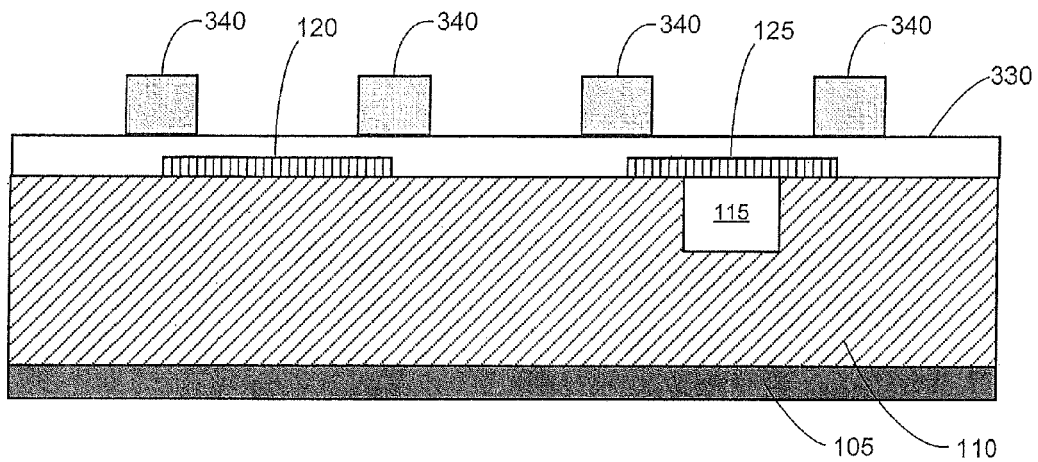
Figure 3F:
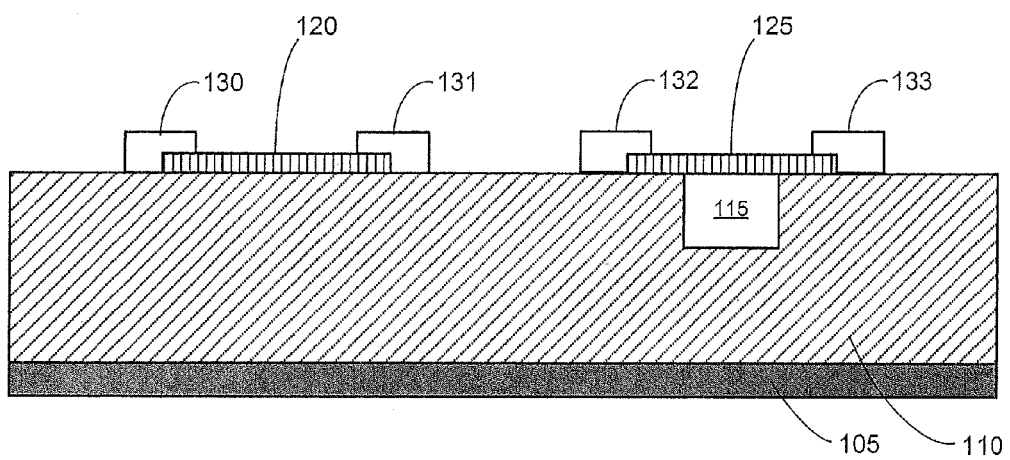

A next step in the fabrication process is to form the sense electrodes 130, 131, 132, and 133 as shown in FIG. 1B, for example. This process begins by depositing one or more layers of conductive material over the structure of FIG. 3D and etching the conducive layer(s) to form the electrodes. In particular, FIG. 3E is a cross-sectional view of the structure of FIG. 3D after forming a layer of conductive material 330 over the graphene membranes 120 and 125 and the insulating layer 110, and forming an etch mask 340 to define the sense electrodes. FIG. 3F is a cross-sectional view of the structure of FIG. 3E after etching the exposed portions of the layer of conductive material 330 using the etch mask 340 down to the insulating layer 110 to form the sense electrodes 130, 131, 132, 133.

The sense electrodes can be formed of conductive materials including, but not limited to, titanium, palladium, gold, aluminum, poly silicon, TiN, TaN, tungsten, or a stack of one or more of such materials. For instance, the conductive layer 330 in FIG. 3E can be formed of multiple layers by sequentially depositing a first seed layer of Ti (about 1 nm thick), a second layer of Pd (about 20-30 nm thick) and a third layer of gold. The seed layer is formed of Ti or any suitable material that has good adhesion on the graphene membranes 120 and 125 and insulating layer 110. The second layer is formed of any suitable material such as Pd that serves to match the work function of the graphene membranes 120 and 125. Preferably, the overall thickness of the sense electrodes 130~133 is in a range of about 20 nm to about 500 nm. The material layers forming the sense electrodes 130~133 may be deposited by using known techniques, such as e-beam, sputtering, chemical vapor deposition, etc., then patterned by a reactive ion etch (RIE) process or a "lift-off" process.

Figure 3G:
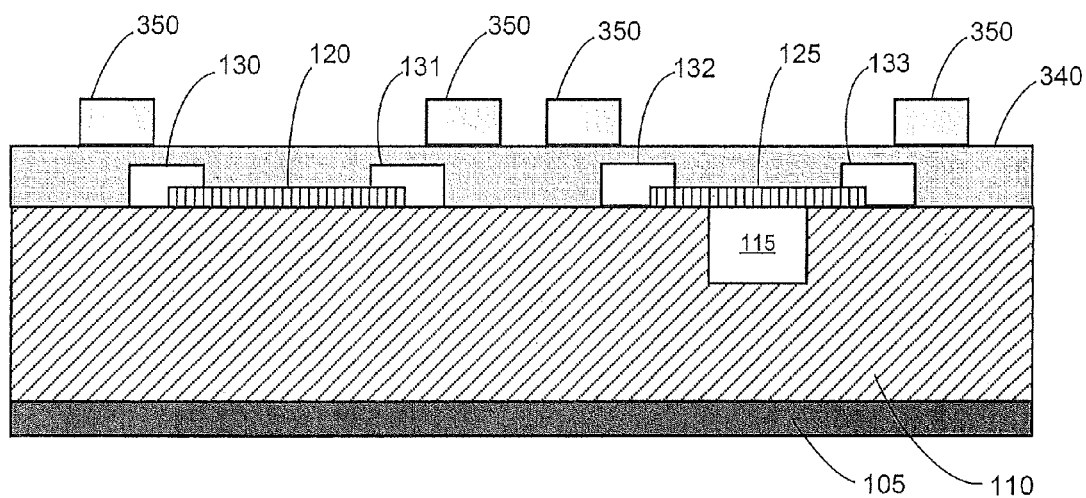
FIG. 3G is a cross-sectional view of the structure of FIG. 3F after depositing a blanket layer of sealing material and forming an etch mask that defines sealing rings to be formed by etching the layer of sealing material.

A next step in the fabrication process is to form the sealing rings 140 and 145 to seal the outer peripheral regions of the sense electrodes 130, 131, 132, 133 and the graphene membranes 120 and 125, as discussed above with reference to FIG. 1A, for example. This process is generally performed by depositing a layer of sealing material over the structure of FIG. 3F and patterning the layer of sealing material by a RIE process, a wet etch process, or a "lift-off" process, to form the sealing rings 140 and 145. In particular, FIG. 3G is a cross-sectional view of the structure of FIG. 3F after depositing a blanket layer of sealing material 340 and forming an etch mask 350 that defines the sealing rings. The layer of sealing material 340 may be formed of any suitable material, such as a spin-on glass material layer, hermetic seal material, or a rubber material, etc., and deposited using known techniques suitable for depositing such material. The sealing rings 140 and 145 shown in FIG. 1A, for example, are formed by etching away those portions of the layer of sealing material 340 exposed by the etch mask 350. FIG. 1B is a cross-sectional view of the resulting structure after etching the layer sealing material 340 and removing the etch mask 350 as shown in FIG. 3G.

It is to be understood that the invention is not limited to the particular materials, features, and processing steps shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. Particularly with respect to processing steps, it is to be emphasized that the descriptions provided herein are not intended to encompass all of the processing steps that may be required to form a functional integrated semiconductor nano-device. Rather, certain processing steps that are commonly used in forming semiconductor devices, such as, for example, wet cleaning and annealing steps, are purposefully not described herein for economy of description. However, one of ordinary skill in the art will readily recognize those processing steps omitted from these generalized descriptions.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method of forming a semiconductor pressure sensor device, comprising:
   forming an insulating layer on a semiconductor substrate;
   forming a recessed cavity in the insulating layer;
   forming a suspended graphene membrane on the insulating layer completely covering the recessed cavity, wherein the suspended graphene membrane has a thickness in a range of about one atomic layer to about ten atomic layers;
   forming a first sense electrode and a second sense electrode on the insulating layer on opposing sides of, and in contact with, the suspended graphene membrane;
   forming a sealing ring around outer sidewalls of the first and second sense electrodes and the suspended graphene membrane
   forming a supported graphene membrane on the insulating layer in a region adjacent to the first graphene membrane, wherein the supported graphene membrane is physically separate from the suspended graphene membrane, and wherein an entire surface area on one side of the supported graphene membrane is in direct contact with the insulating layer;
   forming a third sense electrode and a fourth sense electrode on the insulating layer on opposing sides of, and in contact with, the supported graphene membrane; and
   forming a second sealing ring around outer sidewalls of the third and fourth sense electrodes and the supported graphene membrane,
   wherein the suspended graphene membrane is a part of the semiconductor pressure sensor device that is configured to operate as a device cell for testing pressure of an ambient gas based on a change of resistance of the suspended graphene membrane caused by pressure applied on the suspended graphene membrane by the ambient gas, and wherein the supported graphene membrane is a part of the semiconductor pressure sensor device that is configured to operate as a control cell for determining an amount of change in resistance of the suspended graphene membrane due to chemical doping of the suspended graphene membrane from the ambient gas.

2. The method of claim 1, wherein the recessed cavity is filled with air.

3. The method of claim 1, wherein the recessed cavity contains a vacuum.

4. The method of claim 1, wherein the insulating layer comprises silicon nitride, silicon oxide, hafnium oxide, zirconium oxide, aluminum oxide, aluminum nitride, or boron nitride or a combination thereof.

5. The method of claim 1, wherein a width of the recessed cavity between the first and second sense electrodes is in a range of about 0.2 um to about 5.0 um.

6. The method of claim 1, wherein a depth of the recessed cavity is in a range of about 20 nm to about 300 nm.

7. The method of claim 1, wherein the sealing ring comprises a spin-on glass layer, a Hermetic seal, or a rubber seal.

8. The method of claim 1, wherein the supported graphene membrane has a thickness in a range of about one atomic layer to about ten atomic layers.

* * * * *